(12) United States Patent
Trunz et al.

(10) Patent No.: US 6,366,413 B1
(45) Date of Patent: Apr. 2, 2002

(54) METHOD OF STRAIGHTENING THE SUPPORTING SURFACES OF SUPPORTING ELEMENTS FOR OPTICAL ELEMENTS

(75) Inventors: Michael Trunz, Pfahlheim; Bernhard Gellrich, Aalen, both of (DE)

(73) Assignee: Carl-Zeiss Stiftung, Heidenheim (DE)

( * ) Notice: Subject to any disclaimer, the term of this patent is extended or adjusted under 35 U.S.C. 154(b) by 0 days.

(21) Appl. No.: 09/692,256

(22) Filed: Oct. 19, 2000

(30) Foreign Application Priority Data

Nov. 29, 1999 (DE) .......................................... 199 57 398

(51) Int. Cl.⁷ ................................................ G02B 7/02
(52) U.S. Cl. ........................................ 359/811; 359/819
(58) Field of Search .............................. 359/811, 818, 359/819, 822; 353/100

(56) References Cited

U.S. PATENT DOCUMENTS 6,144,504 A * 11/2000 Sudoh et al. ................ 359/811
6,229,657 B1 * 5/2001 Holderer et al. ............. 359/822
6,310,735 B1 * 10/2001 Best et al. ................... 359/819

FOREIGN PATENT DOCUMENTS

| DE | 19805849 A 1 | 2/1999 |
| EP | 0299111 B1 | 1/1994 |

* cited by examiner

*Primary Examiner*—Georgia Epps
*Assistant Examiner*—Saeed Seyrafi
(74) *Attorney, Agent, or Firm*—Welsh & Katz, Ltd.

(57) ABSTRACT

In a method of straightening the supporting surfaces (5) of supporting elements (3) for optical elements (1), in particular in lens systems of microlithography projection exposure equipment, the supporting elements (3) and/or at least one bearing part (2, 6) connected to the supporting elements (3) for the optical elements (1) are deformed by a laser beam (A, B, C, D) produced by a laser (7) in such a way that the supporting surfaces (5) are at least approximately aligned with a common supporting plane or some other prescribed distribution.

5 Claims, 1 Drawing Sheet

METHOD OF STRAIGHTENING THE SUPPORTING SURFACES OF SUPPORTING ELEMENTS FOR OPTICAL ELEMENTS

FIELD OF THE INVENTION

The invention relates to a method of straightening the supporting surfaces of supporting elements for optical elements in lens systems, in particular semiconductor lens systems.

DESCRIPTION OF THE RELATED ART

To avoid deformations and achieve high precision of lens systems, the optical elements, in particular in lens systems of microlithography projection exposure equipment, are supported by elastic links, by which the optical element is mounted in a mount in such a way that it is isolated in terms of deformation. The elastic links serve in this case in particular for setting small differences in supporting force and consequently for low deformation of the optical element. The small differences in the supporting forces of the individual links are achieved by correspondingly great compliance.

It is disadvantageous in this case, however, that the elastic links are difficult to produce, i.e. that the supporting surfaces of the links are subject to tolerances in surface shape in such a way that they are at different heights. The known formula: supporting force=spring rigidity×spring excursion (F=C×X) only allows the supporting force to be influenced. Since the spring rigidity of the elastic link cannot generally be further reduced for technical production reasons, only the spring excursion offers (as a compensation for tolerance in the surface shape) the possibility of minimizing the relative differences in supporting force or achieving a uniform spring excursion or deflection by the dead weight of the optical element.

The present invention is therefore based on the object of providing a method by which the supporting surfaces can be worked or aligned in such an accurate way that the differences in the positions of the supporting surfaces for the optical elements on the optical elements become as small as possible and consequently a low-deformation mounting is achieved.

SUMMARY OF THE INVENTION

This object is achieved according to the invention by the method steps stated in claim 1.

The use of a laser beam allows the production-related tolerances in the surface shape to be reworked much more accurately. This is achieved by the action of the laser on the supporting elements or the bearing part or parts causing bending, which according to the invention is controlled in such a way that the supporting surfaces for the optical element are subsequently located at least approximately all on the same supporting plane or within a very closely confined supporting range, with a very exact and low-deformation mounting being achieved.

One possible configuration in terms of the method may be that a so-called temperature gradient mechanism is used for the alignment, for the specific introduction of the direction of deformation and the amount of deformation of the elastic element. In the case of the temperature gradient mechanism (TGM), an asymmetric state of stress is established by local heating. The stresses occurring thereby locally exceed the flow limit and lead to plastic deformations and bending of the component toward the laser beam.

One advantage of the method according to the invention is also that, if need be, a repair can also be performed in this way, if for example a supporting element or an elastic spring arm has been bent.

With the method according to the invention it is also possible furthermore to use the laser alignment for isostatics, i.e. the spring arms are not directed at one plane but at a prescribed distribution, so that it is possible to compensate for deformations due to the dead weight, as is the case for example with a three-point mounting due to three-shaft sagging, at the seat or bearing point of the optical element.

It is also conceivable to carry out the method according to the invention under interferometric observation of the deflection of the cemented-in optical element and thus to counteract specifically existing deformations of the inserted optical element.

The use of a laser for straightening workpieces is generally already known. For example, EP 0 299 111 B1 discloses a method of straightening components which are out of true, such as axle journals, crankshafts, camshafts or similar workpieces, by surface hardening by means of a laser beam, with compressive internal stresses being introduced into the workpiece.

DE 198 05 849 also discloses the use of a laser for straightening or adjusting structural parts, for example optical components, which are to be interconnected. Proposed here as a connecting process is a joining technique in the form of soldering and adhesive bonding techniques, as well as welding by means of laser radiation. In this case, precision straightening by means of laser radiation is performed to adjust the structural parts, i.e. for positional changes or positioning operations.

BRIEF DESCRIPTION OF THE DRAWING

Advantageous refinements and developments of the invention emerge from the subclaims and from the method described below with reference to the drawing, in which:

DETAILED DESCRIPTION OF THE INVENTION

Figure 1:
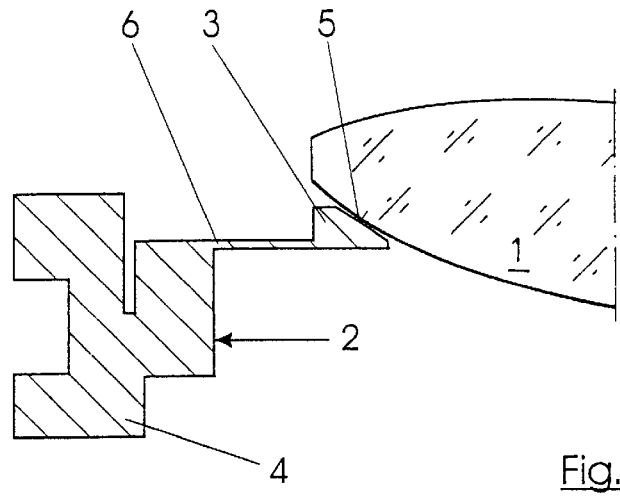
FIG. 1 shows an optical element of a lens system with a supporting element.

An optical element, which in the exemplary embodiment is a lens 1, is mounted on an inner ring 2, which has a plurality of supporting feet 3 distributed over the circumference as supporting elements. The inner ring 2 is connected to a mount 4 or is in one piece with the mount 4. The supporting feet 3, arranged such that they are distributed over the circumference, have in each case a supporting surface 5 for supporting the lens 1. The supporting feet 3 are respectively arranged on a bearing arm 6 at one end of the latter. The angled bearing arm 6 is of an elastic design and may form part of the inner ring 2 or be in one piece with the latter or else extend as a separate part from the inner ring 2 along the optical axis.

Figure 2:
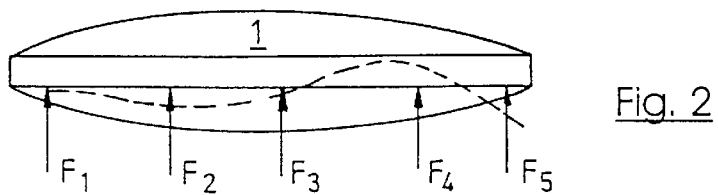
FIG. 2 shows a schematic representation of the deformation of the optical element.

As can be seen from FIG. 2, a deformation of the lens occurs due to different supporting forces $F_1$ to $F_5$, which occur if the supporting feet 3 are deflected differently until they come to bear against the lens 1.

Figure 3:
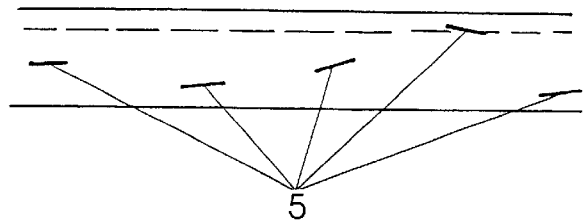
FIG. 3 shows a schematic representation of the position of the supporting surfaces of a plurality of supporting elements.

FIG. 3 at the same time schematically shows a developed projection of the supporting planes of the individual supporting feet 3 with respect to their supporting surfaces 5. As can be seen, in this case five supporting surfaces 5 lie within a specific ACTUAL range of a few 10 μm. It is, however, envisaged to achieve as far as possible a DESIRED supporting surface (see for example the dashed line).

For this purpose, the bearing arms 6, as elastic elements, are subjected to a bombardment with a laser 7. The laser beams produced in this way may be directed at various points of the bearing arms 6 according to the desired bending of the supporting feet 3 (see arrows A to D in FIG. 4).

Figure 4:
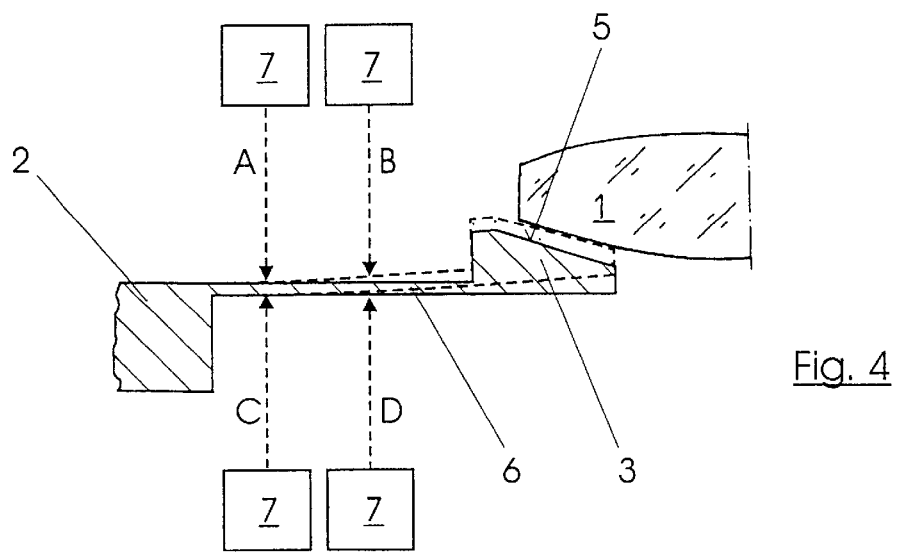
FIG. 4 shows an individual representation of a supporting element with a supporting surface during a laser straightening operation according to the invention.

As can be seen from FIG. 4, the specific input of laser energy brings about a specific bending of the supporting feet 3 and consequently changing of the supporting surfaces 5 for the lens 1. The laser energy is in this case introduced in such a way that all the supporting surfaces 5 are subsequently located within the DESIRED range represented in FIG. 3, (i.e. the upper and dashed lines).

The aligning of the supporting surfaces 5 with the laser 7 may also take place with a cemented-in lens 1 and real-time evaluation of the lens deformation on an interferometer.

If need be, the alignment of the supporting surfaces 5 may also take place in a different distribution, in order for example to counteract or compensate for "sagging" in the case of a three-point mounting or to produce a specific state of deformation, such as for example an astigmatism. This can in turn take place before the placing on of the optical element or else thereafter.

What is claimed is:

1. A method of straightening the supporting surfaces (5) of supporting elements (3) for optical elements (1), in particular in lens systems of microlithography projection exposure equipment, the supporting elements (3) and/or at least one bearing part (2, 6) connected to the supporting elements (3) for the optical elements (1) being deformed by a laser beam (A, B, C, D) produced by a laser (7) in such a way that the supporting surfaces (5) are at least approximately aligned with a common supporting plane or some other prescribed distribution.

2. The method as claimed in claim 1, wherein a temperature gradient mechanism is used for the specific introduction of a laser beam (A, B, C, D).

3. The method as claimed in claim 1, wherein, in a configuration of the supporting elements (3) with supporting feet which, while being distributed over the circumference, are connected to an inner ring (2) as a bearing part in each case via bearing arms (6), the laser beam (A, B, C, D) is directed at the bearing arms (6).

4. The method as claimed in claim 3, wherein the inner ring (2) is produced in one piece with the bearing arms (6).

5. The method as claimed in claim 3, wherein the inner ring (2) is produced in one piece with the mount (4).

* * * * *